(12) United States Patent
Baker

(10) Patent No.: US 9,565,773 B2
(45) Date of Patent: Feb. 7, 2017

(54) METHODS FOR ASSEMBLING ELECTRONIC DEVICES WITH ADHESIVE

(71) Applicant: Apple Inc., Cupertino, CA (US)

(72) Inventor: John J. Baker, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 166 days.

(21) Appl. No.: 14/231,454

(22) Filed: Mar. 31, 2014

(65) Prior Publication Data

US 2015/0282329 A1    Oct. 1, 2015

(51) Int. Cl.
*B05D 3/00* (2006.01)
*H05K 3/28* (2006.01)
*H01L 21/56* (2006.01)
*C09J 5/00* (2006.01)
*B05D 3/02* (2006.01)
*B05D 3/06* (2006.01)
(Continued)

(52) U.S. Cl.
CPC .......... *H05K 3/284* (2013.01); *C09J 5/00* (2013.01); *H01L 21/563* (2013.01); *H05K 3/288* (2013.01); *B05D 3/0254* (2013.01); *B05D 3/067* (2013.01); *B05D 3/108* (2013.01); *C09J 2203/326* (2013.01); *C09J 2205/302* (2013.01); *C09J 2205/31* (2013.01); *H05K 1/0284* (2013.01); *H05K 2201/0251* (2013.01); *H05K 2201/0254* (2013.01); *H05K 2203/0126* (2013.01); *H05K 2203/0285* (2013.01); *H05K 2203/0292* (2013.01); *H05K 2203/0783* (2013.01); *H05K 2203/092* (2013.01); *H05K 2203/102* (2013.01); *H05K 2203/107* (2013.01); *H05K 2203/1163* (2013.01); *H05K 2203/1194* (2013.01)

(58) Field of Classification Search
USPC .............................. 427/96.2, 348, 372.2, 384
See application file for complete search history.

(56) References Cited

U.S. PATENT DOCUMENTS 5,834,339 A * 11/1998 Distefano ............ H01L 21/561
257/E21.504
6,372,544 B1 * 4/2002 Halderman .......... H01L 21/563
257/E21.503
(Continued)

FOREIGN PATENT DOCUMENTS

WO    2010001032    2/2010

*Primary Examiner* — Brian K Talbot
(74) *Attorney, Agent, or Firm* — Treyz Law Group, P.C.; G. Victor Treyz; Joseph F. Guihan

(57) ABSTRACT

An electronic device may have housing structures, electrical components, and other electronic device structures. Adhesive may be used to join electronic device structures. Adhesive may be dispensed as liquid adhesive and cured to form adhesive joints. Adhesive joints may be debonded. Chain reactions may be initiated by applying a localized initiator such as a chemical or localized energy to the adhesive. Once initiated, the chain reaction may spread throughout the adhesive to cure the adhesive, to globally change adhesive viscosity, or to weaken the adhesive to facilitate debonding. Local changes to adhesive may also be made such as local increases and decreases to adhesive viscosity. Chain reaction curing may be used to cure adhesive or debond adhesive that is hidden from view within gaps in the electronic device structures. Viscosity changes may be used to control where adhesive flows.

12 Claims, 14 Drawing Sheets

(51) Int. Cl.
 *B05D 3/10* (2006.01)
 *H05K 1/02* (2006.01)

(56) References Cited

U.S. PATENT DOCUMENTS

| | | | |
|---|---|---|---|
| 6,373,142 B1* | 4/2002 | Hoang | H01L 21/563 257/783 |
| 6,936,644 B2* | 8/2005 | Gilleo | C08G 59/188 523/205 |
| 7,056,767 B2* | 6/2006 | Liang | H01L 21/563 228/180.22 |
| 7,488,518 B2 | 2/2009 | Ortlieb et al. | |
| 2003/0096453 A1* | 5/2003 | Wang | H01L 21/563 438/108 |
| 2003/0194833 A1* | 10/2003 | Quinones | H01L 21/563 438/108 |
| 2004/0033543 A1* | 2/2004 | Schwab | C07K 16/2863 435/7.23 |
| 2005/0118748 A1* | 6/2005 | Sambasivam | H01L 21/563 438/106 |
| 2006/0223933 A1* | 10/2006 | Rubinsztajn | C08K 3/0016 524/492 |
| 2007/0082203 A1* | 4/2007 | Canelas | C08F 210/06 428/413 |
| 2007/0099346 A1* | 5/2007 | Farooq | H01L 21/563 438/108 |
| 2007/0269930 A1* | 11/2007 | Gupta | H01L 21/563 438/108 |
| 2008/0265435 A1* | 10/2008 | Charles | H01L 21/563 257/778 |
| 2011/0127633 A1 | 6/2011 | Nadeau et al. | |
| 2012/0089180 A1 | 4/2012 | Fathi et al. | |
| 2012/0225172 A1 | 9/2012 | Bates et al. | |
| 2013/0059105 A1 | 3/2013 | Wright et al. | |
| 2013/0064967 A1* | 3/2013 | Feinstein | B05C 9/12 427/8 |

* cited by examiner

METHODS FOR ASSEMBLING ELECTRONIC DEVICES WITH ADHESIVE

BACKGROUND

This relates generally to electronic devices, and, more particularly, to assembling structures in electronic devices using adhesive.

Electronic devices include components such housing structures, electrical devices, printed circuits, and other device structures. Some structures may be assembled using screws and other fasteners. In other situations, adhesive is used to attach structures together.

It can be challenging to assemble structures in electronic devices using adhesive. Light-cured adhesive can be difficult to cure within recesses that are hidden from view. Liquid adhesive can be too viscous to dispense into narrow gaps or can be insufficiently viscous so that the adhesive wicks into locations where no adhesive is desired. After curing adhesive, it can be difficult to disassemble joined parts without damaging the parts.

It would therefore be desirable to be able to provide improved arrangements for using adhesive to join structures in electronic devices.

SUMMARY

An electronic device may have housing structures, electrical components, and other electronic device structures. Adhesive may be used to join structures such as electronic device structures for an electronic device.

Adhesive may be dispensed as uncured liquid adhesive. The liquid adhesive can be cured to form adhesive joints. Adhesive joints may subsequently be debonded to facilitate rework, repair, debugging, and failure analysis.

Chain reactions may be initiated by applying a localized initiator such as a chemical or localized energy to the adhesive. Once initiated the chain reaction may spread throughout the adhesive to cure the adhesive, to globally change adhesive viscosity, or to weaken the adhesive to facilitate debonding.

Local changes to adhesive may also be made such as local increases and decreases to adhesive viscosity. Locally applied energy may be used to locally adjust adhesive viscosity. Adhesive viscosity can also be locally adjusted using patterned viscosity-increasing material and viscosity-decreasing material.

Chain reactions may be used to cure adhesive or to debond adhesive that is hidden from view within gaps in the electronic device structures. Viscosity changes may be used to control where adhesive flows. For example, adhesive viscosity can be increased to prevent adhesive from flowing into areas in which no adhesive is desired. Adhesive viscosity can be decreased to facilitate wicking of adhesive under integrated circuits and other components mounted on a printed circuit to underfill the components.

DETAILED DESCRIPTION

Adhesive may be used or joining structures such as structures formed from plastic, metal, glass, ceramic, carbon-fiber composite material and other composites, and other materials. The adhesive may be cured using heat, light (e.g., ultraviolet light or visible light), chemicals (e.g., moisture), and other suitable curing agents. Adhesive debonding operations may be performed by weakening cured adhesive using a chemical such as a solvent, heat, light, or other adhesive weakening agents. Local changes may be made to adhesive viscosity, thereby controlling the flow of adhesive when joining structures together. Chain reactions can be used to cure adhesive, to weaken adhesive, to change adhesive viscosity, or to otherwise modify adhesive properties. Chain reactions can be initiated locally in a limited portion of an adhesive layer and, once initiated, can propagate throughout the entire adhesive layer.

Figure 1:
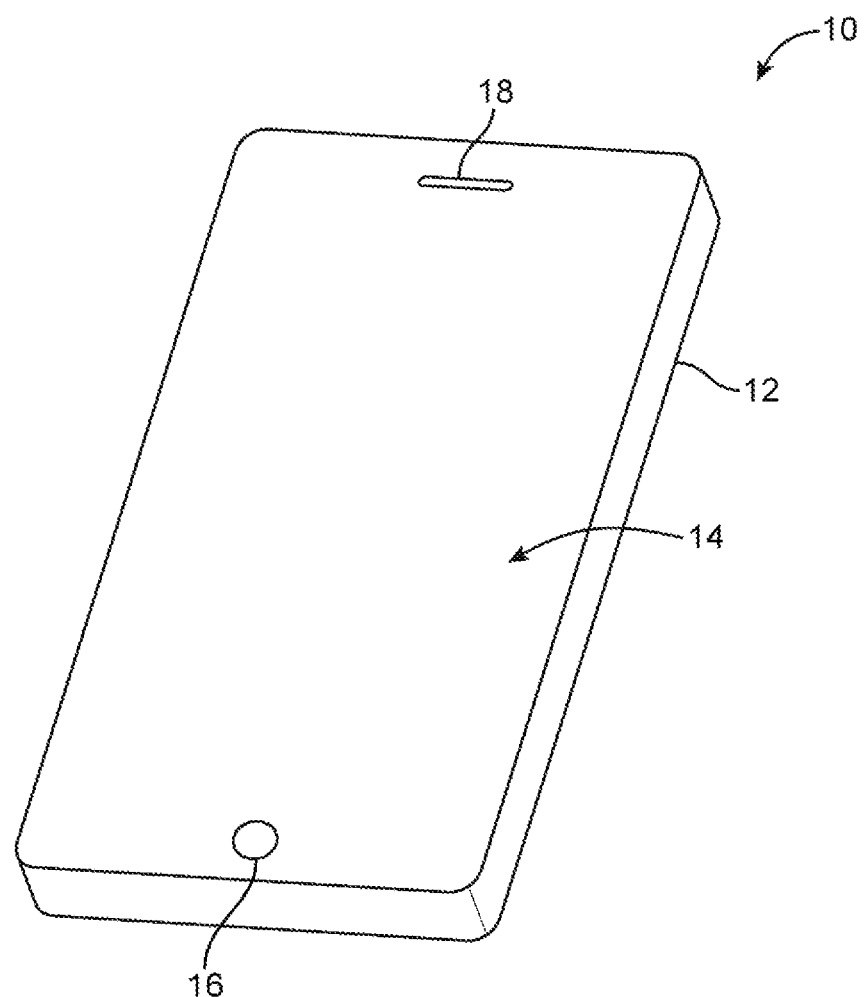
FIG. 1 is a perspective view of an illustrative electronic device such as a handheld computing device of the type that may be provided with structures joined with adhesive in accordance with an embodiment.

Structures in an electronic device or other structures may use adhesive-based assembly and disassembly operations such as these. FIG. 1 is a perspective view of an illustrative electronic device of the type that may be include structures that are attached to each other using adhesive. An electronic device such as electronic device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

Device 10 may have one or more displays such as display 14 mounted in housing structures such as housing 12. Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable display pixel structures such as organic light-emitting diode display pixels, electrophoretic display pixels plasma display pixels, etc.

Electronic device 10 may include control circuitry. The control circuitry of device 10 may include storage and processing circuitry for controlling the operation of device 10. Control circuitry in device 10 may, for example, include storage such is hard disk drive storage, nonvolatile memory (e.g., flash memory or other electrically-programmable-read-only memory configured to form a solid state drive), volatile memory (e.g., static or dynamic random-access-memory), etc. Control circuitry in device 10 may include processing circuitry based on one or more microprocessors, microcontrollers, digital signal processors, baseband processors, power management units, audio codec chips, application specific integrated circuits, etc.

Input-output devices in device 10 may be used to allow data to be supplied to device 10 and to allow data to be provided from device 10 to external devices. Input-output devices for device 10 may also include input-output components with which a user can control the operation of device 10. A user may, for example, supply commands through input-output devices in device 10 and may receive status information and other output from device 10 using the output resources of input-output devices in device 10.

Input-output devices for device 10 may include sensors and status indicators such as an ambient light sensor, a proximity sensor, a temperature sensor, a pressure sensor, a magnetic sensor, an accelerometer, a touch sensor, a fingerprint sensor, and light-emitting diodes and other components for gathering information about the environment in which device 10 is operating and providing information to a user of device 10 about the status of device 10. Device 10 may include audio components such as speakers and tone generators for presenting sound to a user of device 10 and microphones for gathering user audio input. The input-output devices of device 10 may include one or more displays. Displays may be used to present images for a user such as text, video, and still images. Sensors in device 10 may include a touch sensor array that is formed as one of the layers in display 14. During operation, user input may be gathered using buttons and other input-output components such as touch pad sensors, buttons, joysticks, click wheels, scrolling wheels, touch sensors such as a touch sensor array in a touch screen display or a touch pad, key pads, keyboards, vibrators, cameras, and other input-output components. The input-output devices of device 10 may include wired and wireless communications circuitry (e.g., circuitry to support digital data communications, a radio-frequency transceiver and antennas for supporting wireless communications, etc.).

Adhesive may be used in attaching together the structures of device 10 such as the structures of the control circuitry and input-output circuitry of device 10, the structures associated with housing 12, and other device components. Portions of electrical components can be attached to each other and electronic components can be mounted to housing structures or other structures using adhesive. As an example, layers in a display may be assembled using adhesive, internal and external housing structures, mounting brackets, printed circuits, integrated circuits, control circuitry components, input-output components, and other structural and electrical components associated with device 10 may be attached to each other and to other structures in device 10 using adhesive. Adhesive may also be used to encapsulate components. For example, adhesive may be used to encapsulate integrated circuits or other electrical components that are mounted on a printed circuit board.

It can be time consuming to globally heat adhesive to cure the adhesive. Global heating is also sometimes not desirable because excessive heat may damage sensitive components. Light-based adhesive curing can reduce the need to apply heat during curing. Light-based curing schemes involve application of ultraviolet light or visible light to cure adhesive. In light-based schemes, it can be challenging to apply light to adhesive that is blocked from view by opaque structures. For example, it can be challenging to apply ultraviolet light to liquid adhesive that is in a recess between opposing opaque structures.

If desired, adhesives can be provided with additives that promote chain reactions. The chain reactions can be used to cure liquid adhesive, to increase or decrease the viscosity of liquid adhesive, to weaken cured adhesive to facilitate debonding operations, or to otherwise modify the properties of adhesive. The additives may include one or more chemical additives, microspheres or other particles, hollow microspheres that have been filled with one or more chemical additives, fibers, or other materials.

Chain reactions in the adhesive may be globally or locally initiated. For example, an adhesive-changing chain reaction may be locally initiated by applying an initiator to a localized portion of the adhesive. Illustrative chain reaction initiators include chemical initiators and energy-based initiators. Examples of chemical initiators include moisture (i.e., water), other liquids, gaseous agents (e.g., oxygen), and other chemicals (i.e., catalysts) in liquid, gaseous, and/or solid form. Examples of energy-based initiators include heat, visible light, ultraviolet light, infrared light, energy in the form of radio-frequency signals, electrons or other energized particles, other forms of radiation, alternating current (AC) and direct current (DC) electrical current, and sound waves (e.g., ultrasonic energy, a shock from an impact, audible sound waves, or other sonic energy). Other types of initiators may be used if desired. These examples of adhesive-changing chain reaction initiators are merely illustrative.

Figure 2:
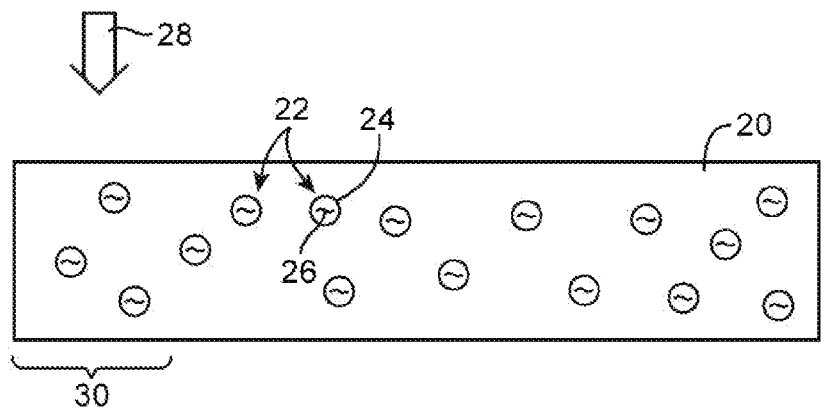
FIG. 2 is a cross-sectional side view of adhesive which is being locally modified to initiate a chain reaction in accordance with an embodiment.
Figure 3:
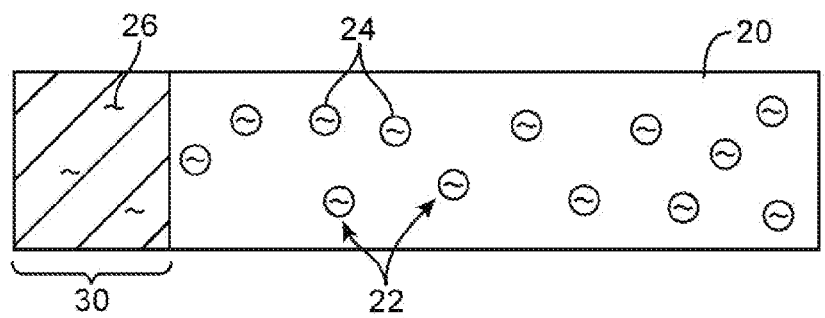
FIG. 3 is a cross-sectional side view of the adhesive of FIG. 2 showing how the local modification to the adhesive creates a resulting localized change in the properties of the adhesive in accordance with an embodiment.
Figure 4:
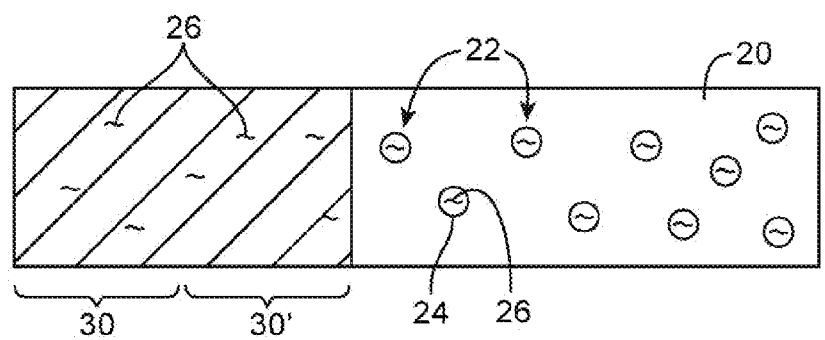
FIG. 4 is a cross-sectional side view of the adhesive of FIG. 3 showing how the localized change in the adhesive can propagate to an adjacent portion of the adhesive in accordance with an embodiment.

FIGS. 2, 3, and 4 illustrate how a locally initiated chain reaction may propagate through an adhesive. As shown in FIG. 2, adhesive 20 may include additive 22. In the example of FIG. 2, additive 22 includes a mechanical agent such as hollow microspheres 24 filled with a chemical agent such as agent 26. Additive 22, which may sometimes be referred to as a chain-reaction propagation agent or agent, may be used to promote propagation of a chain reaction that has been locally initiated throughout the entirety of adhesive 20.

As shown in FIG. 2, local chain reaction initiator 28 may be applied to localized region 30 of adhesive 20. The application of initiator 28 causes additive 22 to change its state in region 30. As an example, microspheres 24 may dissolve, be ruptured, or may otherwise be changed so that chemical agent 26 is released into adhesive 20 and can react with adhesive 20. As part of this reaction, adhesive 20 may change its state, as shown by region 30 in FIG. 3. For example, if adhesive 20 is initially in an uncured state, region 30 of FIG. 3 may be cured adhesive. As another example, if adhesive 20 is initially viscous, region 30 of FIG. 3 may be characterized by reduced viscosity. In scenarios in which adhesive 20 initially has a relatively low viscosity, changed region 30 of FIG. 3 may be characterized by an increased viscosity. In some scenarios, it is desirable to weaken cured adhesive to help debond an adhesive joint. In this type of situation, adhesive 20 is initially in a cured state. The exposure of adhesive 20 in region 30 to chemical agent 26 (e.g., a solvent) may serve to weaken the adhesive in region 30 of FIG. 3 relative to the remaining adhesive.

The curing of adhesive 20 or other change to the state of adhesive 20 in region 30 of FIG. 3 may be the result of exposure of adhesive 20 to agent 26 of additive 22. Agent 26 may, for example, include a curing-promoting component such as moisture or other chemical that promotes adhesive curing (i.e., polymer cross-linking), may be a chemical that increases adhesive viscosity, may be a chemical that reduces adhesive viscosity, or may be a chemical that weakens adhesive (e.g., a solvent that softens and/or dissolves cured adhesive). The change in the state of adhesive 20 in region 30 of FIG. 3 may, if desired, be the result of the production of heat, light, or other byproduct of the reaction between agent 26 and adhesive 20.

The change in state of adhesive in region 30 may serve to propagate a chain reaction that spreads throughout the remainder of adhesive 20. As an example, the reaction of agent 26 of additive 22 with adhesive 20 may produce heat in region 30. The heat that is produced in region 30 may be conducted to adjacent portions of adhesive 20 (e.g., by thermal conduction through adhesive 20). Once the adjacent portion of adhesive 20 has been heated such as adjacent portion 30' of FIG. 4, the heat that is present in that adjacent region will cause additive 22 in region 30' to change its state (e.g., the heat will case cause agent 26 to be released front microspheres 24). The released agent 26 will then react with adhesive in region 30 to change the state of adhesive 20 in region 30', just as when initiator 28 was applied to region 30 of FIG. 2. In the example of FIGS. 2, 3, and 4, heat may be used to cause microspheres 24 to dissolve, be ruptured, or exhibit other changes in region 30' so that chemical agent 26 is released into adhesive 20 and can react with adhesive 20 to change the state of adhesive 20 in region 30'. Other types of change to additive 22 and adhesive 20 can be initiated using initiator 28 if desired.

The process that has been started in regions 30 and 30' can continue in a chain reaction, with each newly changed area producing additional heat that, in turn changes the state of a new adjacent area, until the state of all of adhesive 20 has changed (i.e., until all of adhesive 20 has been cured, until the viscosity of all of adhesive 20 has increased, until the viscosity of all of adhesive 20 has decreased, or until the strength of all of adhesive 20 has been weakened). If desired, a chain reaction that changes the state of adhesive 20 can be propagated throughout adhesive 20 by producing other reaction byproducts that can affect adjacent portions of adhesive 20 besides heat (e.g., chemical byproducts, light, etc.). The production of heat when additive 20 (agent 26) locally reacts with adhesive 20 is merely illustrative.

Figure 5:
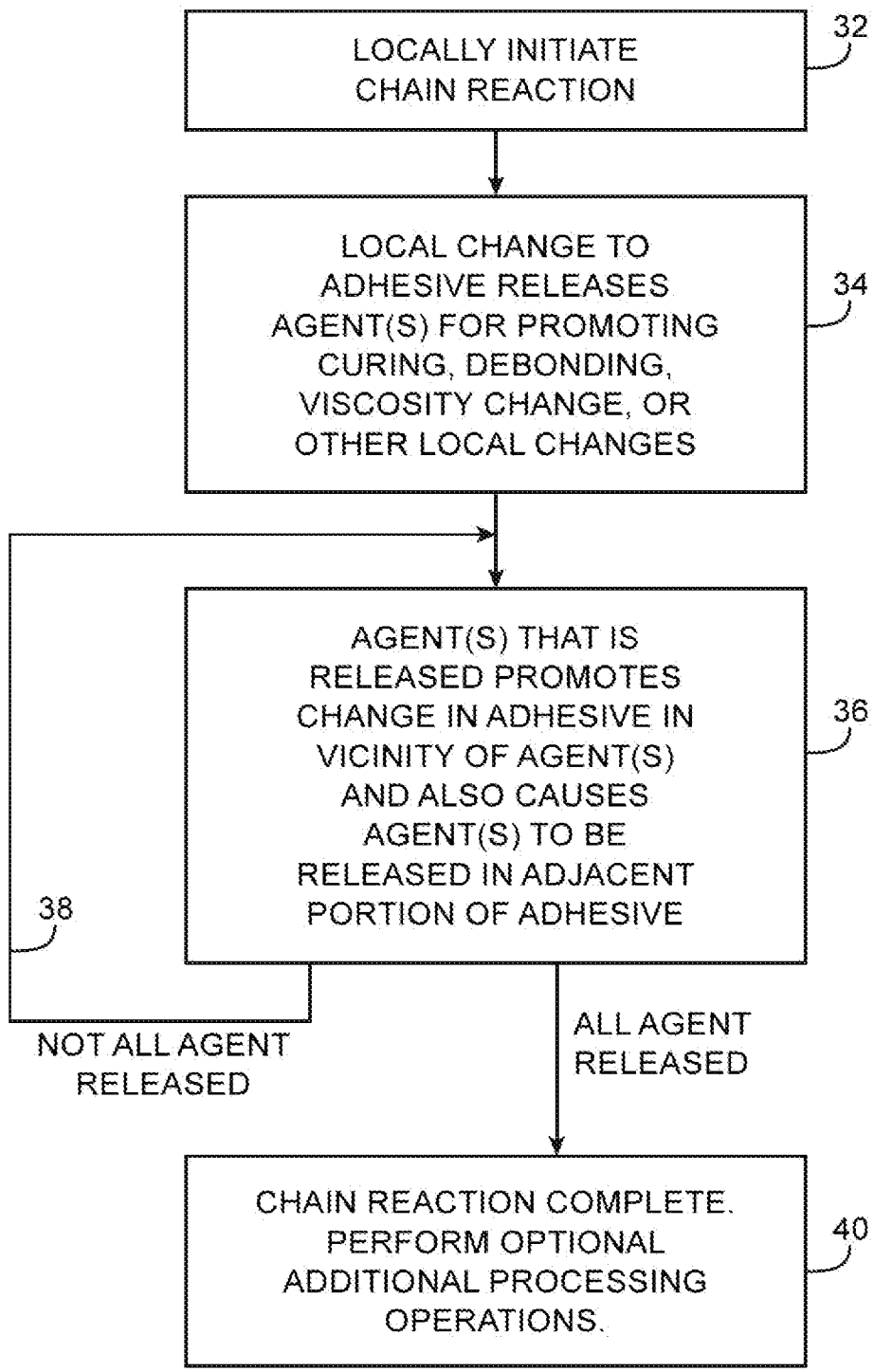
FIG. 5 is a flow chart of illustrative steps involved in using a chain reaction to modify an adhesive in accordance with an embodiment.

Illustrative steps involved in modifying the properties of adhesive 20 using a locally initiated chain reaction are shown in FIG. 5. At step 32, initiator 28 is applied to a portion of adhesive 20 (see, e.g., localized region 30 of adhesive 20 in FIG. 2). Adhesive 20 is in an initial state (cured, uncured, liquid, solid, low viscosity, high viscosity, etc.).

The application of initiator 28 to region 30 of adhesive 20 causes a local change in region 30 of adhesive 20 (e.g., previously uncured adhesive is cured, adhesive viscosity is increased, adhesive viscosity is decreased, adhesive strength is weakened, adhesive temperature is raised, the amount of chemical byproduct or other reaction byproduct is increased, etc.).

Due to thermal conduction, light transmission, chemical diffusion, or other mechanism(s), the local change that is made at step 34 propagates to an adjacent portion of adhesive 20 and causes a local change in that adjacent region, as described in connection with FIG. 4.

As indicated by line 38, so long as some adhesive 20 remains in its unchanged state, the chain reaction may continue. Once all of adhesive 20 has changed its state, the chain reaction is complete (step 40). Optional additional operations may then be performed on adhesive 20 (e.g., global operations such as heating adhesive 20 globally to further change its state to facilitate curing, viscosity change, debonding, etc.).

A chain reaction scheme may be used to process adhesive 20 in scenarios in which traditional global processing schemes are difficult or impossible. Consider, as an example, a scenario of the type shown in FIG. 6 in which adhesive 20 is present between device structures 42 and 44. Chain reaction initiation equipment 50 locally applies initiator 28 to adhesive 20. Chain reaction initiation equipment 50 may be a laser, light-emitting diode, lamp or other light source for producing light, may be a chemical dispensing nozzle or other equipment for dispensing chemicals, may be a heat source for producing heat, or may be other equipment for initiating a chain reaction of the type described in connection with FIG. 5.

Adhesive 20 in region 46 is uncovered (i.e., not shadowed by structures 42 and 44) and can therefore be exposed to initiator 28 (e.g., light, heat, a chemical such as water vapor, liquid water, gaseous reactant, liquid reactant, etc.). However, adhesive 20 in region 48 is embedded in a recess between structures 42 and 44 and is therefore shadowed and prevented from being exposed to initiator 28. For example, structures 42 and 44 may be opaque and may prevent a light-based initiator such as ultraviolet light from reaching adhesive 20 in region 48. As another example, it may not be possible to expose adhesive 20 in region 48 to a desired chemical or heat.

Although adhesive 20 in region 48 is blocked from exposure to initiator 28, initiator 28 may be locally applied to adhesive 20 in region 46. The application of initiator 28 may cause portion 30 of adhesive 20 to change, as shown in FIG. 6.

Figure 6:
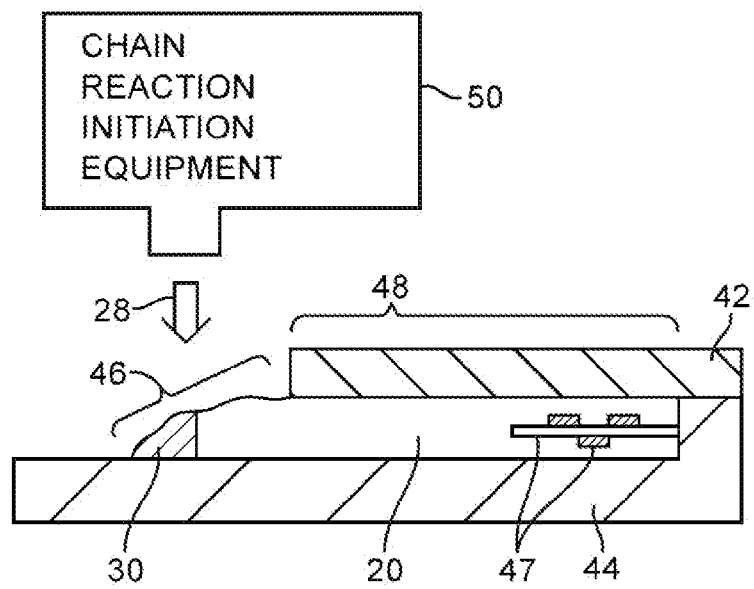
FIG. 6 is a diagram showing how a chain reaction can be initiated in a portion of an adhesive that is not shadowed in accordance with an embodiment.
Figure 7:
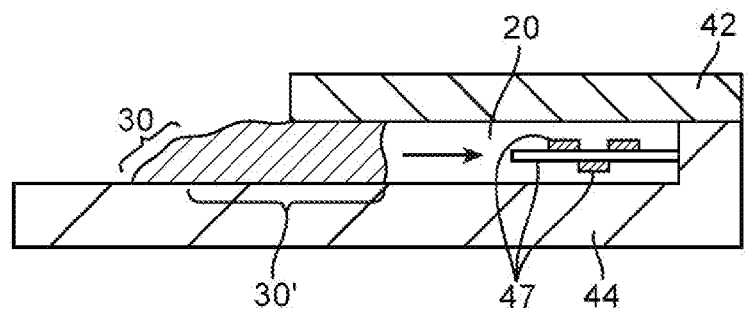
FIG. 7 is a diagram showing how the chain reaction that was initiated using the equipment of FIG. 6 may propagate to an adjacent portion of the adhesive that is in a location that is blocked from view in accordance with an embodiment.
Figure 8:
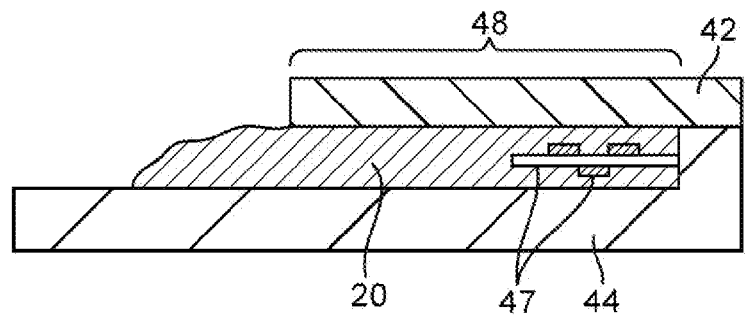
FIG. 8 is a diagram showing how the adhesive of FIG. 6 may be cured following propagation of the chain reaction through the adhesive in accordance with an embodiment.

Due to the chain-reaction properties of adhesive 20, the change that is caused in region 30 of FIG. 6 propagates to region 30' of FIG. 7 and, in turn to all of the rest of adhesive 20, including the adhesive in blocked region 48, as shown in FIG. 8.

This type of chain reaction process may be used to cure adhesive in region 48, may be used to raise or lower the viscosity of adhesive in region 48, or may be used to weaken adhesive 20 in region 48. If desired, components may be embedded within the gap filled by adhesive 20 (see, e.g., components 47 of FIGS. 6, 7, and 8, which may include electrical components mounted on a printed circuit board, connector pins, and other device structures).

Figure 9:
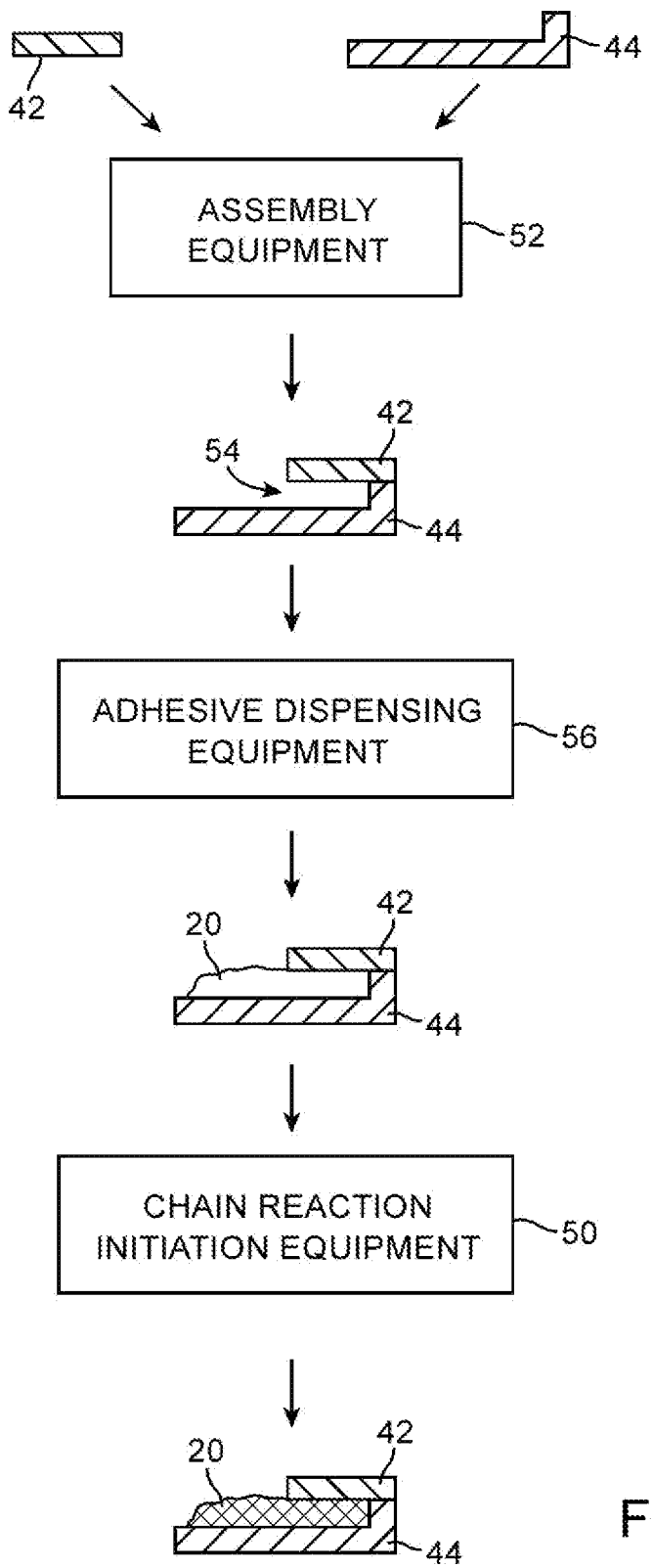
FIG. 9 is a diagram showing equipment and operations that may be used in assembling structures in an electronic device using adhesive in accordance with an embodiment.

An illustrative system and operations involved in performing chain reaction operations on adhesive 20 are shown in FIG. 9. In the example of FIG. 9, adhesive 20 is dispensed in liquid form and is cured to attach components in electronic device 10 together.

Initially, components such as electronic device components or other structures such as structures 42 and 44 may be assembled using assembly equipment 52 of FIG. 9. Assembly equipment 52 may include computer-controlled positioners, manually controlled fixtures and positioners, and other equipment for positioning structures 42 and 44 relative to each other.

When assembled, a gap such as gap 54 may be produced between portions of structures 42 and 44. This gap can be filled by dispensing adhesive 20 into gap 54 in liquid form. Adhesive dispensing equipment 56 may include a needle dispenser, a spray dispenser, an adhesive dispensing nozzle, ink-jet printing equipment, or other equipment for dispensing liquid adhesive 20. Adhesive 20 may have as relatively low viscosity (i.e., adhesive 20 may be a thin uncured adhesive liquid) to promote wicking into gap 54.

After filling gap 54 with uncured liquid adhesive, chain reaction initiation equipment 50 may initiate a chain reaction in an exposed portion of adhesive 20. The localized exposure of adhesive 20 to initiator 28 may cause adhesive 20 to locally cure. The localized exposure of adhesive 20 may also trigger to chain reaction that cures the rest of adhesive 20, including the portions of adhesive 20 in gap 54, thereby attaching structure 42 to structure 44 (and, if desired, encasing any components in gap 54 in adhesive 20).

Figure 10:
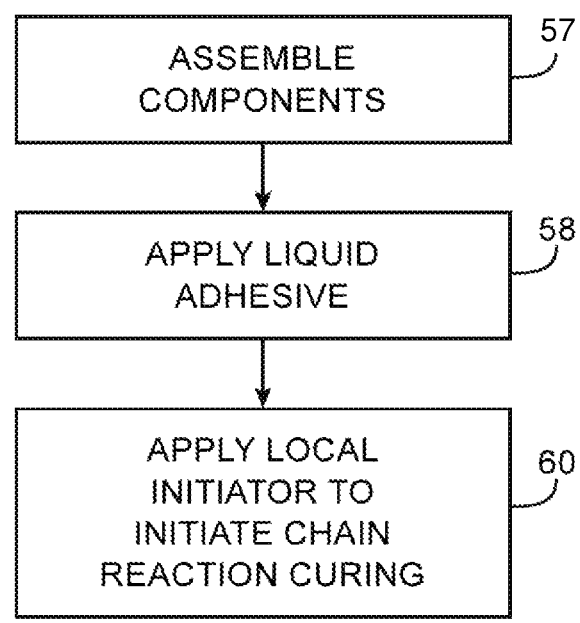
FIG. 10 is a flow chart of illustrative steps involved in assembling structures using equipment of the type shown in FIG. 9 in accordance with an embodiment.

Illustrative steps involved in using equipment of the type shown in FIG. 9 to cure adhesive 20 using a chain reaction are shown in FIG. 10. At step 57, equipment such as assembly equipment 56 may be used to place structures that are to be bonded together such as device components 42 and 44 of FIG. 9 into desired positions.

Adhesive dispensing equipment 56 can apply uncured liquid adhesive to components 42 and 44 at step 58. Adhesive can be applied after components 42 and 44 have been assembled using equipment 52 or may be applied to component 42 and/or component 44 before components 42 and 44 have been assembled. Arrangements in which more than two components are attached with adhesive may also be used (see, e.g., embedded components 47 of FIGS. 6, 7, and 8).

After components 42 and 44 have been assembled and after liquid adhesive 20 is in place, chain reaction initiation equipment 50 may be used to apply initiator 28 to an exposed area of uncured liquid adhesive 20 (step 60). This initiates chain reaction curing of all of adhesive 20 and thereby forms an adhesive bond that attaches components 42 and 44 together.

Figure 11:
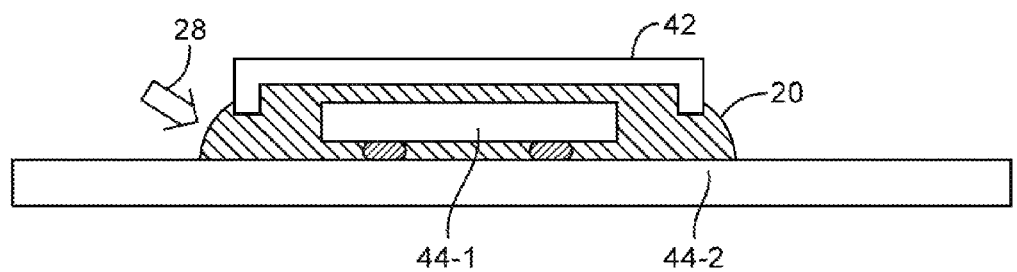
FIG. 11 is a cross-sectional side view of structures that have been joined using adhesive showing how a chain reaction may be initiated in the adhesive to weaken the adhesive in accordance with an embodiment.

In some situations, it may be desirable to use a chain reaction to facilitate debonding of a previously formed adhesive bond between electronic device components. This type of scenario is illustrated in FIG. 11. As shown in the example of FIG. 11, structures 42, 44-1, and 44-2 may be attached together with cured adhesive 20. Structure 44-2 may be a printed circuit (e.g., a rigid printed circuit board formed from a rigid printed circuit board material such as fiberglass-filled epoxy or a flexible printed circuit formed from a sheet of polyimide or other flexible polymer layer). Structure 44-1 may be an integrated circuit or other electronic component that is soldered to printed circuit 44-2. Structure 42 may be to shield can lid that forms part of an electromagnetic shield for integrated circuit 44-1. Other structures may be debonded if desired. These structures are merely illustrative.

During initial assembly operations, integrated circuit 44-1 was soldered to printed circuit 44-2 and shield can lid 42 was used to cover integrated circuit 44-1. Cured adhesive 20 was used to encapsulate integrated circuit 44-1 and attach lid 42 to integrated circuit 44-1 and printed circuit 44-2. Due to the presence of shadowing lid 42, it is not possible (in this example) to expose adhesive 20 under lid 42 to light or chemicals. Accordingly, chain reaction initiation equipment 50 is used to apply initiator 28 to an exposed (unshadowed) portion of cured adhesive 20. The exposure of adhesive 20 to initiator 28 locally weakens adhesive 20 and via chain reaction, weakens all of adhesive 20, including the portions of adhesive 20 under shield lid 42. Once all of adhesive 20 has been weakened, lid 42 may be removed. The ability to debond adhesive joints in this way may be used to facilitate rework and repair and to allow components of device 10 to be examined during failure analysis and prototyping.

Figure 12:
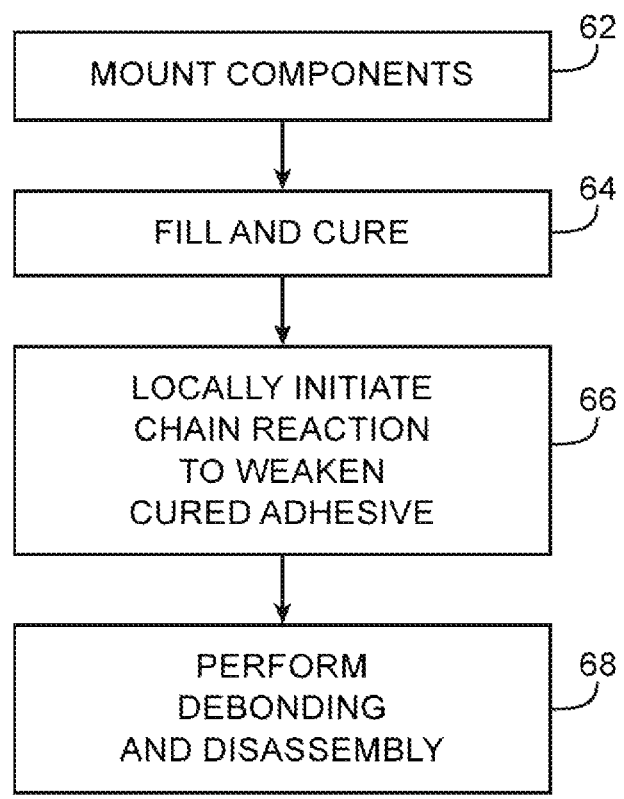
FIG. 12 is a flow chart of illustrative steps involved in debonding structures by weakening adhesive using a locally initiated chain reaction in accordance with an embodiment.

FIG. 12 is a flow chart of illustrative steps involved in debonding adhesive joints by initiating an adhesive-weakening chain reaction by exposing a portion of cured adhesive 20 to a debonding chain-reaction initiator.

At step 62, components such as components 42, 44-1, and 44-2 may be assembled. For example, assembly equipment 52 may be used to solder integrated circuit 44-1 to printed circuit 44-2, may be used to solder a shield fence for an electromagnetic interference shield to printed circuit 44-2, may be used to attach shield lid 42 to the shield fence or other structures, etc.

At step 64, liquid adhesive may be applied to the assembled structures (e.g., liquid adhesive 20 may be used to encapsulate integrated circuit 44-1 and fill the gaps between structures 44-1, 44-2, and 42, as shown in FIG. 11). The uncured liquid adhesive may be cured using a global curing process or other curing process. As an example, adhesive 20 may be cured using a chain reaction started by an initiator or by heat mg structures 42, 44-1, and 44-2 in an oven or otherwise exposing structures 42, 44-1, and 44-2 to elevated temperatures.

At step 68, when it is desired to debond the adhesive joint that has been formed, chain reaction initialization equipment 50 may be used to apply initiator 28 to an exposed portion of the cured adhesive 20. The debonding chain reaction that is initiated in this way propagates throughout cured adhesive 20, weakening all of adhesive 20 and thereby facilitating subsequent debonding and disassembly operations (step 68).

It may sometimes be desired to increase the viscosity of adhesive 20 to prevent adhesive 20 from wicking into recesses between components where no adhesive is wanted. Using a catalyst such as moisture or other chemical and/or locally applied light, heat or other energy, adhesive 20 can be changed (locally, or globally via chain reaction) from a relatively low viscosity state to a relatively high viscosity state. This type at approach is shown in FIG. 13.

Figure 13:
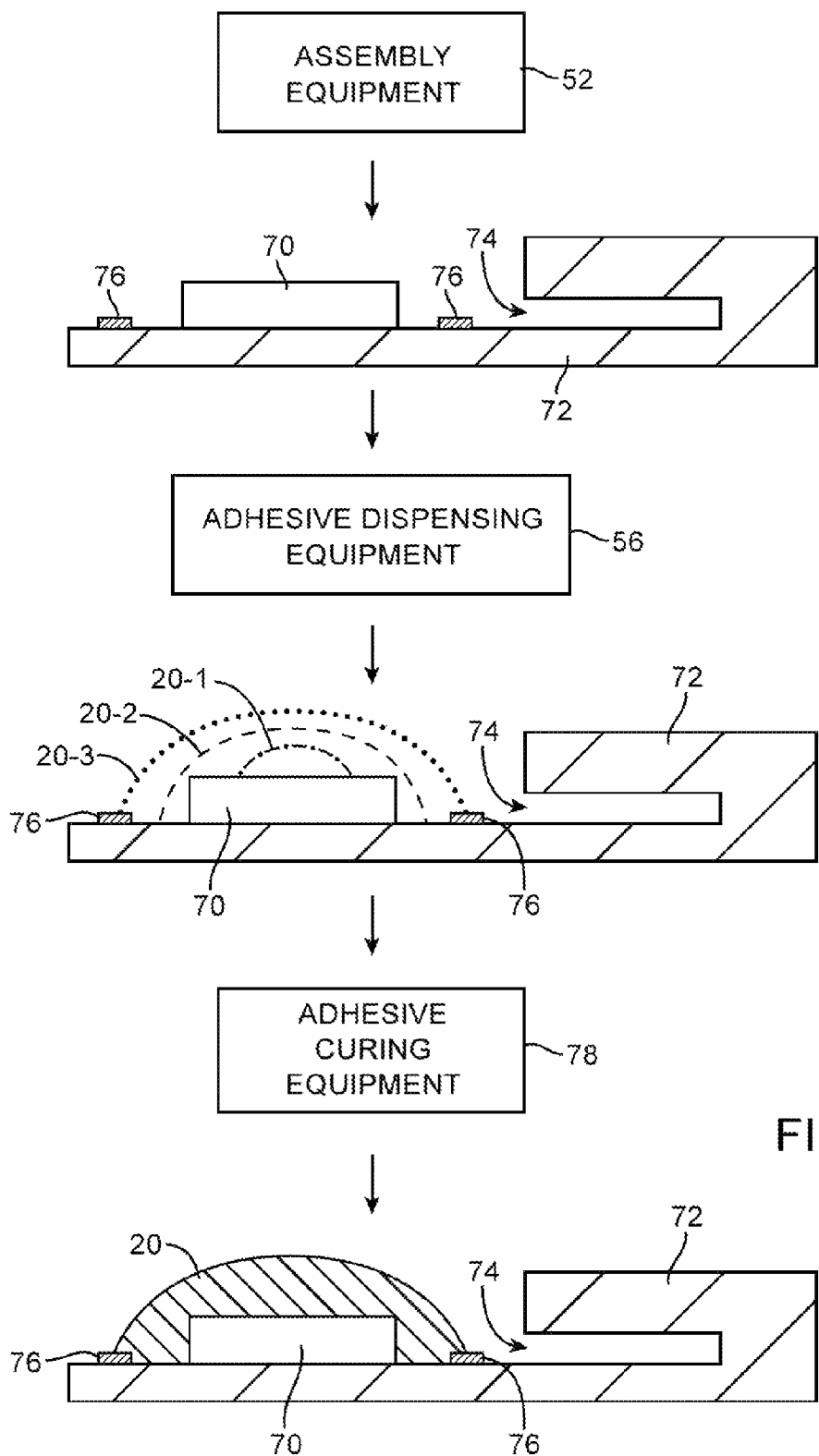
FIG. 13 is a system diagram showing equipment and operations involved in locally enhancing adhesive viscosity in accordance with an embodiment.

As shown in FIG. 13, electronic device structure 72 may have a gap or other recess such as gap 74. There is a potential for liquid adhesive to wick into gap 74. In the example of FIG. 13, it is desired to keep gap 74 free from adhesive. Accordingly, viscosity-increasing material 76 and/or localized energy in the vicinity of structures 76 may be supplied to increase the viscosity of adhesive 20 once adhesive 20 has spread outward sufficiently to reach material 76 and/or the localized energy in the vicinity of structures 76.

In the FIG. 13 example, it is desired to encapsulate component 70 on structure 72 with adhesive. Structure 72 may be a printed circuit or other substrate. Component 70 may be an integrated circuit or other electronic device component.

Initially, adhesive dispensing equipment 56 may dispense uncured liquid adhesive onto the center of component 70. The adhesive initially occupies area 20-1. As more adhesive is dispensed from equipment 56, the adhesive flows outwards to region 20-2. The liquid adhesive that is dispensed has a relatively low viscosity, which facilitates the spreading of adhesive 20. Finally, a sufficient amount of liquid adhesive has been dispensed onto component 70 that the adhesive has flowed outward enough to overlap viscosity-increasing material 76 and/or the viscosity-increasing, light heat, or other energy that is applied in the vicinity of structures 76 (see, e.g., adhesive area 20-3 of FIG. 13). At this point, the viscosity of the liquid adhesive increases. The viscosity increase may be local (i.e., in the vicinity of material 76, in the vicinity of the locally applied energy, etc.) or the viscosity increase may be global (i.e., by including a viscosity-increasing additive in adhesive 20 that supports a viscosity-increasing chain reaction through adhesive 20 that is initiated by material 76 or the applied energy in the vicinity of material 76).

The viscosity increase that is imparted to adhesive 20 ensures that the outward flow of adhesive 20 is constrained, thereby preventing adhesive 20 from flowing into gap 74. Adhesive 20 may then be cured using adhesive curing equipment 78 (e.g., by application of global and/or local energy or by application of moisture or other adhesive-curing-promotion chemical).

Figure 14:
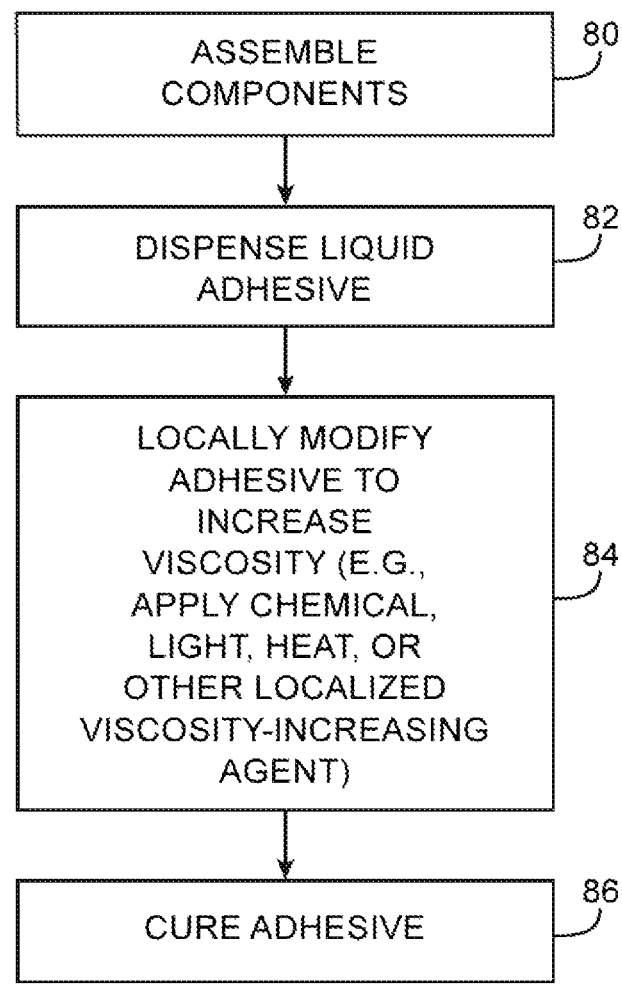
FIG. 14 is a flow chart of illustrative steps involved in locally increasing adhesive viscosity in accordance with an embodiment.

Illustrative steps involved in using increases to the viscosity of adhesive 20 during the formation of adhesive joints between electronic device components are shown in FIG. 14.

As shown in FIG. 14, electronic device components can be assembled at step 80. For example, assembly equipment 52 may be used to solder components together, may be used to weld components together, may be used to attach components with fasteners, adhesive, or other attachment techniques. It may be desired to encapsulate some of the assembled structures using adhesive.

At step 82, adhesive dispensing equipment 56 (FIG. 13) may dispense liquid adhesive onto the structures that are to been encapsulated (see, e.g., structure 70 of FIG. 13). Adhesive viscosity-increasing material 76 may be deposited on the structures that are being encapsulated using material deposition equipment such as ink-jet printing equipment, pad printing equipment, nozzle-based equipment, a needle-dispenser, physical vapor deposition equipment, chemical vapor deposition equipment, or other equipment for deposing and patterning material (e.g., in a ring or other pattern surrounding structure 70). In addition to providing viscosity-increasing material 76 or as an alternative to using material 76, localized energy such as light, heat, or other energy may be supplied to the location occupied by material 76 (e.g., in a ring on the surface of structure 72 that surrounds component 70 or other suitable pattern).

At step 84, a localized viscosity-increasing agent such as material 76 and/or locally supplied energy from a light source, heat source, or other energy source is used to locally increase the viscosity of adhesive 20 to prevent adhesive 20 from flowing beyond desired boundaries (and, if desired, globally increases the viscosity of adhesive 20 through a chain reaction). By controlling the flow of adhesive 20 prior to curing, adhesive 20 can be prevented from intruding into sensitive areas where no adhesive is desired (see, e.g., recess 74 of FIG. 13).

At step 86, adhesive 20 can be cured (e.g., using an oxen or other structure that applies curing energy to adhesive 20 such as adhesive curing equipment 78 of FIG. 13).

In situations in which it is desired to underfill an integrated circuit or other component or in other situations, it may be desirable to decrease the viscosity of adhesive 20. Using a catalyst such as moisture or other chemical agent and/or an energy-based agent such is locally applied light, heat, or other energy, adhesive 20 can be changed (locally, or globally via chain reaction) from a relatively high viscosity state to a relatively low viscosity state. This type of approach is illustrated in FIG. 15.

Figure 15:
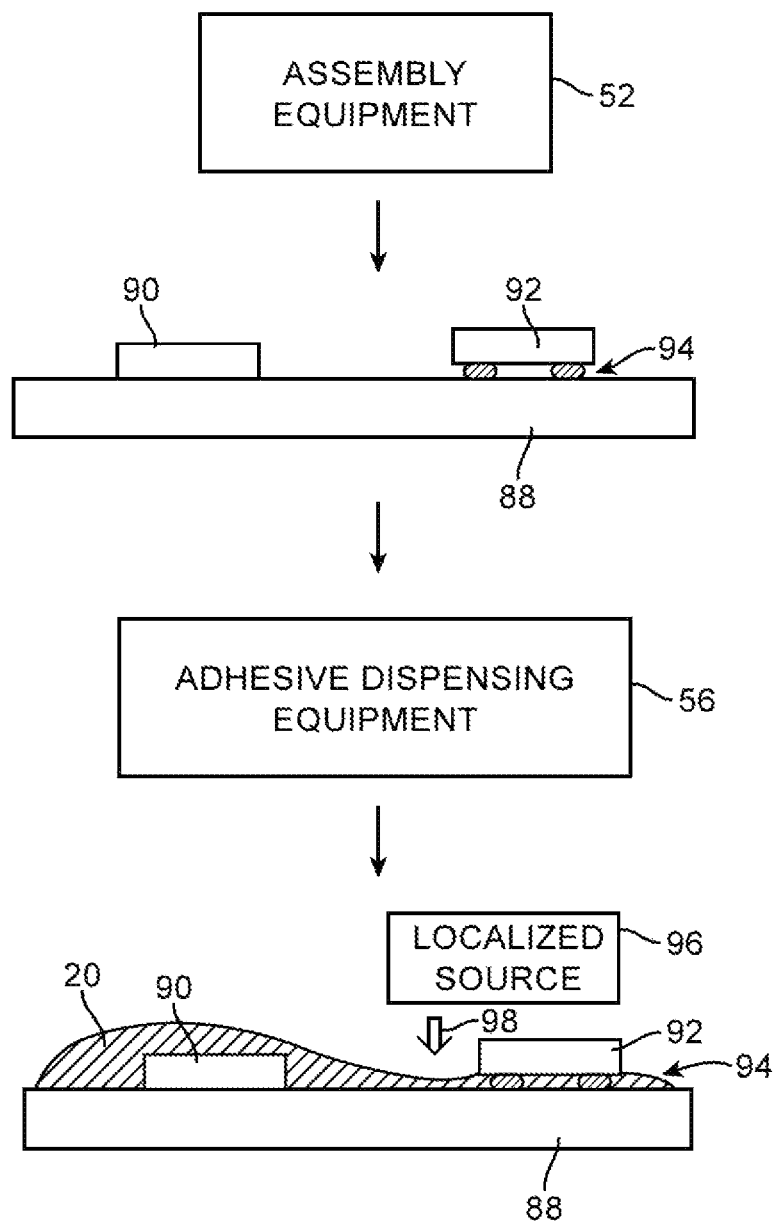
FIG. 15 is a system diagram showing equipment and operations involved in locally decreasing adhesive viscosity in accordance with an embodiment.

As shown in FIG. 15, assembly equipment 52 may be used to assemble electronic device components such as structures 90, 92, and 88. As assembled, there may be gaps within these components such as illustrative gap 94 between the underside of component 92 and the upper surface of component 88. It may be desirable to ensure that liquid adhesive is viscous enough to cover component 90 (e.g., to encapsulate component 90) while also ensuring that the liquid adhesive is thin enough to wick into gap 92 under component 92. Accordingly, localized energy 98 and/or viscosity-decreasing material in the vicinity of energy 98 may be supplied to decrease the viscosity of adhesive 20 once adhesive 20 has spread outward sufficiently to reach energy 98 (and/or viscosity-decreasing material at the same location as energy 98).

In the FIG. 15 example, it is desired to encapsulate component 90 on structure 88 with adhesive and it is desired to underfill component 92 by providing adhesive in gap 94. Structure 88 may be a printed circuit or other substrate. Component 90 may be an electrical or structural component. Component 92 may be an integrated circuit that is soldered to printed circuit 88 or may be another electronic device component.

Adhesive dispensing equipment 56 may dispense uncured liquid adhesive onto the center of component 90. The adhesive flows outwards until some of the adhesive is exposed to energy 98 from localized energy source 96 (e.g., a laser, light-emitting diode, lamp, or other light source, a heat source, etc.) or localized viscosity-reducing material (e.g., moisture or other chemical, etc.). The localized viscosity reducing agent (energy and/or viscosity-reducing material) reduces the viscosity of adhesive 20 so that the reduced-viscosity adhesive may flow into recess 94. Curing equipment (e.g., an oven) may then be used to heat adhesive 20 to an elevated temperature to cure adhesive 20. If desired, a localized source such as source 96 may be used to apply localized energy to adhesive 20 to increase adhesive viscosity, as described in connection with FIG. 13.

Figure 16:
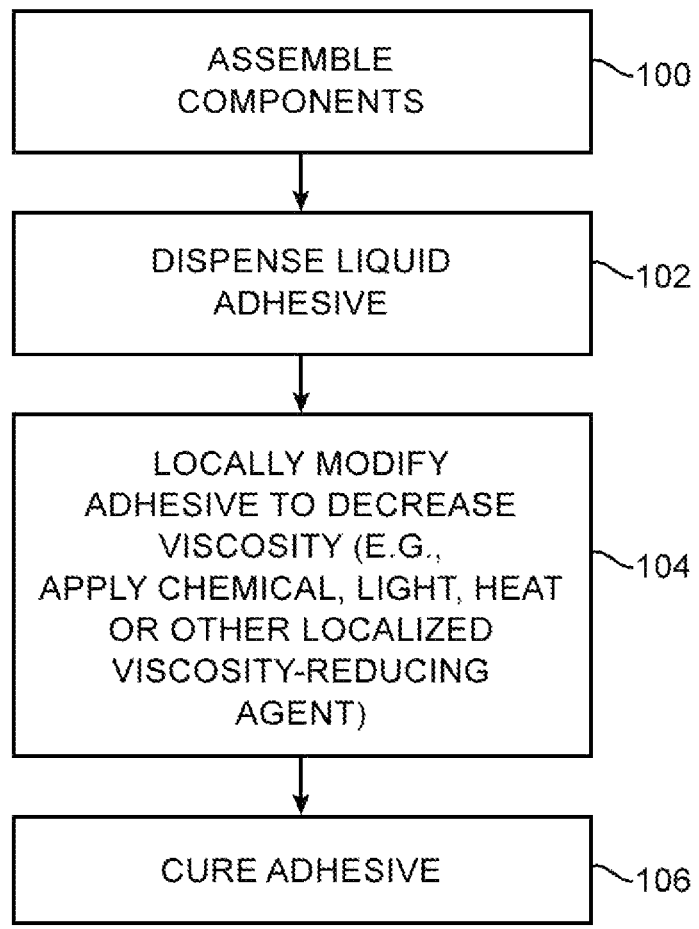
FIG. 16 is a flow chart of illustrative steps involved in locally reducing adhesive viscosity in accordance with an embodiment.

Illustrative steps involved in using local viscosity-decreasing material and/or energy to selectively reduce the viscosity of adhesive 20 are shown in FIG. 16. As shown in FIG. 16, components such as components 88, 92, and 90 may be assembled at step 100 (e.g., using assembly equipment 52).

At step 102, adhesive dispensing equipment 56 may dispense uncured liquid adhesive on the components.

Localized source 96 may provide localized energy 98 and/or locally patterned viscosity-decreasing material may be provided at desired locations on the assembled components. At step 104, as the flowing adhesive that was deposited at step 102 reaches the viscosity-reducing agent such as locally applied energy from source 96 and/or the viscosity-decreasing material, the properties of the adhesive are modified (e.g., locally) to decrease the viscosity of the adhesive. This allows the adhesive to flow into gaps such as gap 94 of FIG. 15. Some of the adhesive such as the adhesive that remains over component 90 of FIG. 15 may retain an unreduced viscosity so that the adhesive that does not have reduced viscosity can be used to encapsulate the component.

At step 106, the adhesive that has been dispensed and that has flowed to desired regions of the assembled components can be cured. For example, an oven or other heat source may be used to apply heat that elevates the temperature of adhesive 20 to cure adhesive 20.

If desired, both viscosity-increasing and viscosity-decreasing materials can be deposited on the same electronic device structures during assembly.

Figure 17:
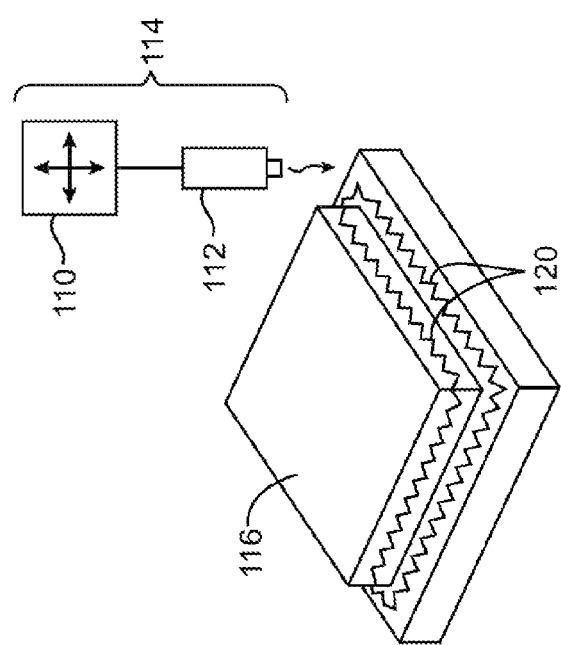
FIG. 17 is a perspective view of an illustrative structure to which adhesive is being applied in accordance with an embodiment.

As shown in FIG. 17, adhesive dispensing equipment 114 may apply liquid adhesive 120 to an electronic device component such as a shield can lid or other structure (component 116). Equipment 114 may include an adhesive dispensing head such as nozzle 112 and a positioner such as computer-controlled positioner 110 for controlling the position of nozzle 112 as adhesive 120 is dispensed.

Figure 18:
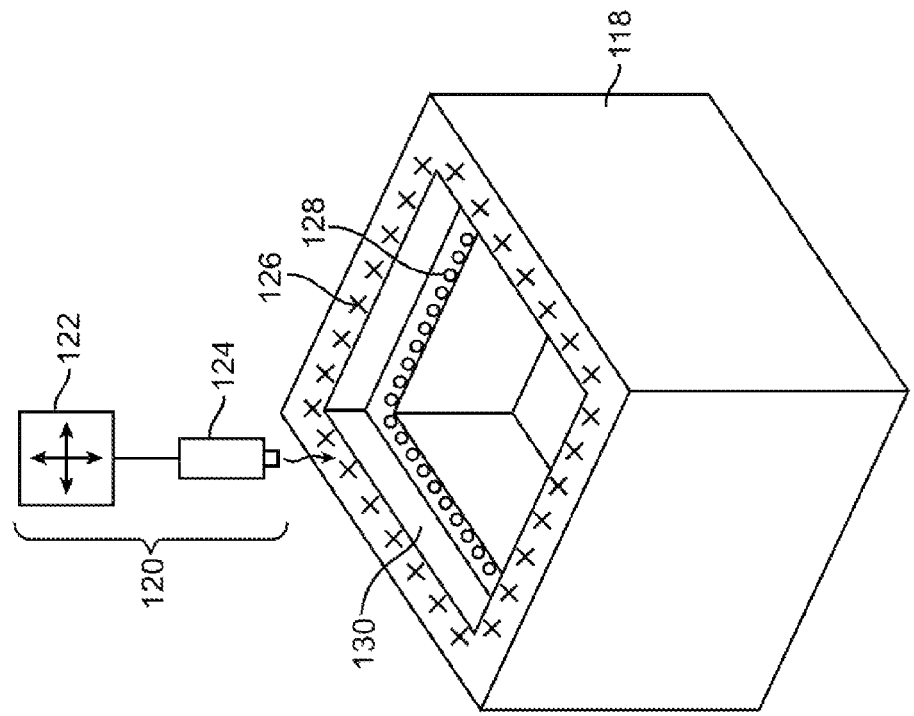
FIG. 18 is a perspective view of an illustrative structure that is configured to mate with the structure of FIG. 17 and that has been selectively coated with adhesive-viscosity-increasing material and adhesive-viscosity-decreasing material in accordance with an embodiment.

Component 116 may have a shape that mates with a box-like component (e.g., part of a shield structure such as a shield can body) such as component 118 of FIG. 18. Before lid 116 is attached to body 118, equipment 120 may dispense adhesive-viscosity-decreasing material 126 and adhesive-viscosity-increasing material 128 on body 118. Equipment 120 may dispense materials 126 and 128 by using computer-controlled positioner 122 to control the position of dispensing head (nozzle) 124.

Figure 19:
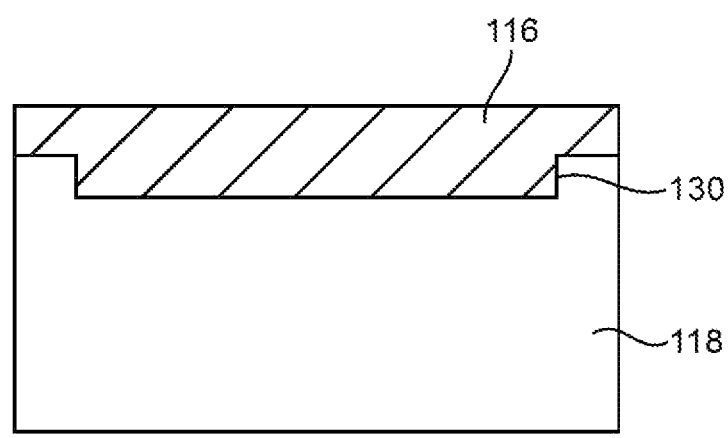
FIG. 19 is a cross-sectional side view of the structures of FIGS. 17 and 18 following assembly and attachment using adhesive in accordance with an embodiment.

When lid 116 is attached to body 118, material 126 locally decreases the viscosity of adhesive 120 to promote wicking of adhesive 120 along the interface formed between inner sidewall 130 of body 118 and the corresponding surface of lid 116. Material 128 increases the viscosity of adhesive 120 to prevent the wicking liquid adhesive from flowing too far into the interior of body 118. A cross-sectional side view of lid 116 in an assembled position on top of body 118 is shown in FIG. 19.

If desired, a technique of the type described in connection with FIGS. 17, 18, and 19 in which both local viscosity enhancement and local viscosity reduction techniques are used may be used in combination with localized techniques for curing and or debonding and/or may be used in combination with techniques for initiating chain reactions (e.g., for curing, debonding, viscosity enhancement, and/or viscosity reduction). The configuration of FIGS. 17, 18, and 19 is merely illustrative.

The foregoing is merely illustrative and various modifications can be made by those skilled in the art without departing from the scope and spirit of the described embodiments. The foregoing embodiments may be implemented individually or in any combination.

What is claimed is:

1. A method for attaching structures in an electronic device, comprising:
   dispensing adhesive in a gap within the structures; and
   in a localized area of the adhesive that is uncovered by the structures, initiating a chain reaction in the adhesive that changes all of the adhesive both inside and outside of the gap, wherein initiating the chain reaction comprises applying energy to only the localized area.

2. The method defined in claim 1 wherein applying the energy to only the localized area comprises:
   applying light to only the localized area.

3. The method defined in claim 1 wherein applying the energy to only the localized area comprises:
   applying heat to only the localized area.

4. The method defined in claim 1 wherein applying the energy to only the localized area comprises applying sound to only the localized area.

5. The method defined in claim 1 wherein initiating the chain reaction comprises initiating an adhesive curing chain reaction that cures all of the adhesive.

6. The method defined in claim 1 wherein initiating the chain reaction comprises initiating an adhesive-viscosity-increasing chain reaction that increases adhesive viscosity for all of the adhesive.

7. The method defined in claim 1 wherein initiating the chain reaction comprises initiating an adhesive-viscosity-decreasing chain reaction that decreases adhesive viscosity for all of the adhesive.

8. The method defined in claim 1 wherein initiating the chain reaction comprises initiating an adhesive-weakening chain reaction to debond the adhesive.

9. A method, comprising:
   dispensing liquid adhesive on an electronic device structure, wherein the electronic device structure includes a localized area with adhesive-viscosity-increasing material;
   increasing the viscosity of the liquid adhesive with the adhesive-viscosity-increasing material by flowing the dispensed liquid adhesive until the liquid adhesive reaches the adhesive-viscosity-increasing material, wherein reaching the adhesive-viscosity-increasing material causes only portions of the liquid adhesive that are adjacent to the adhesive-viscosity-increasing material to increase in viscosity; and applying localized energy to only the portions of the liquid adhesive that are adjacent to the adhesive-viscosity-increasing material, wherein applying the localized energy initiates a chain reaction in the adhesive that spreads throughout all of the adhesive.

10. The method defined in claim 9 wherein the electronic device structure includes an integrated circuit and a printed circuit board to which the integrated circuit is mounted, and wherein the adhesive-viscosity-increasing material comprises material on the printed circuit board.

11. The method defined in claim 9 further comprising:
    decreasing the viscosity of the liquid adhesive with adhesive-viscosity-decreasing material.

12. The method defined in claim 11 wherein decreasing the viscosity comprises flowing the dispensed liquid adhesive until the liquid adhesive reaches the adhesive-viscosity-decreasing material.

\* \* \* \* \*